(12) United States Patent
Inoue

(10) Patent No.: US 7,183,200 B2
(45) Date of Patent: Feb. 27, 2007

(54) METHOD FOR FABRICATING A SEMICONDUCTOR DEVICE

(75) Inventor: Kengo Inoue, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 223 days.

(21) Appl. No.: 11/066,570

(22) Filed: Feb. 28, 2005

(65) Prior Publication Data
US 2005/0227476 A1 Oct. 13, 2005

Related U.S. Application Data

(63) Continuation of application No. PCT/JP03/05458, filed on Apr. 28, 2003.

(51) Int. Cl.
*H01L 21/4763* (2006.01)
*H01L 23/52* (2006.01)

(52) U.S. Cl. ........................ 438/636; 257/759

(58) Field of Classification Search ........ 257/750–753, 257/758–760; 438/631–636, 669–672
See application file for complete search history.

(56) References Cited

U.S. PATENT DOCUMENTS

| 6,228,760 | B1 | 5/2001 | Yu et al. | |
| 7,011,868 | B2 * | 3/2006 | Waldfried et al. | 427/489 |
| 7,030,468 | B2 * | 4/2006 | Gates et al. | 257/632 |
| 7,098,149 | B2 * | 8/2006 | Lukas et al. | 438/778 |
| 2002/0100984 | A1 | 8/2002 | Oshima et al. | |
| 2002/0192945 | A1 * | 12/2002 | Nagahara | 438/637 |
| 2005/0029669 | A1 * | 2/2005 | Inoue et al. | 257/774 |

FOREIGN PATENT DOCUMENTS

| JP | 11-233292 | 8/1999 |
| JP | 2002-124568 | 4/2002 |
| JP | 2002-520849 | 7/2002 |
| JP | 2002-526916 | 8/2002 |
| JP | 2003-100718 | 4/2003 |
| TW | 495911 B | 7/2002 |
| WO | WO 00/03425 | 1/2000 |

OTHER PUBLICATIONS

Taiwanese Office Action dated Mar. 16, 2006, issued in corresponding Taiwanese Patent Application No. 092109901.
Stanley Wolf Ph.D, "Silicon Processing for the VLSI Era" Process Technology, 2000, vol. 1, Second Edition, pp. 202-206, 223, Lattice Press, Sunset Beach, California.

(Continued)

*Primary Examiner*—Calvin Lee
(74) *Attorney, Agent, or Firm*—Westerman, Hattori, Daniels & Adrian, LLP.

(57) ABSTRACT

A semiconductor device has a multi-layer interconnection structure with a first interlayer insulation film and a second interlayer insulation film that is formed on the first interlayer insulation film and has a hardness and an elastic modulus larger than those of the first interlayer insulation film, and is fabricated by a step of forming a resist film on the second interlayer insulation film via an antireflective film, a step of exposing to light and developing the resist film to form a resist pattern, and a step of patterning the antireflective film and the multi-layer interconnection structure using the resist pattern as a mask, wherein a film with no stress or for storing compressive stress is used as the antireflective film.

10 Claims, 19 Drawing Sheets

OTHER PUBLICATIONS

Hong Xiao, "Introduction to Semiconductor Manufacturing Technology", 2001, p. 404, and 411, Prentice Hall, Upper Saddle River, NJ, Columbus, Ohio.

Evert P. Van de Ven, "Advantages of Dual Frequency PECVD for Deposition of ILD and Passivation Films", Jun. 12-13, 1990, p. 194-201, Novellus Systems, Inc., San Jose, CA.

* cited by examiner

METHOD FOR FABRICATING A SEMICONDUCTOR DEVICE

CROSS-REFERENCE TO RELATED APPLICATIONS

The present application is a U.S. continuation application filed under 35 U.S.C. 111(a) claiming benefit under 35 U.S.C. 120 and 365(c) of International Patent Application No. PCT/JP03/05458 filed on Apr. 28, 2003, the entire contents of which are hereby incorporated by reference.

BACKGROUND OF THE INVENTION

1. Field of the Invention

The present invention relates generally to a semiconductor device and, particularly, to a method for fabricating a semiconductor device having a multi-layer interconnection structure.

2. Description of the Related Art

Conventionally, an effort for speeding up of a working speed according to a scaling law has been made by finely miniaturizing a semiconductor device. On the other hand, a multi-layer interconnection structure is used for interconnecting among respective semiconductor devices in a recent high-density semiconductor integrated circuit device but, with regard to such a multi-layer interconnection structure, when the semiconductor device is very finely miniaturized, interconnection patterns in the multi-layer interconnection structure are close to each other and the problem of an interconnection delay caused by a parasitic capacitance among the interconnection patterns occurs.

Consequently, in order to solve the problem of the interconnection delay in the multi-layer interconnection structure, conventionally, a study has been made to use a low dielectric constant film (so-called low-K film) represented by a hydrocarbon-type or fluorocarbon-type organic insulation film instead of a conventionally used $SiO_2$-based insulation film, as an insulation film that composes an interlayer insulation film in the multi-layer interconnection structure, and to use low-resistant copper (Cu) instead of conventionally used Al for interconnection patterns. Although such an organic insulation film generally has a dielectric constant of 2.3–2.5, the value is lower than that of the conventional $SiO_2$ interlayer insulation film by 40–50%.

Since the low dielectric constant film generally has a small density, there remain problems of the adhesive property with the interconnection pattern, humidity resistance, etc. Accordingly, at present, a so-called hybrid structure is frequently used in which the low dielectric constant film and the Cu interconnection pattern are used for a lower layer part of the multi-layer interconnection structure, where an ultra-fine interconnection pattern is formed and the problem of the interconnection delay may be serious, and the conventional $SiO_2$ interlayer insulation film that is excellent in the adhesion properties is used for an upper layer part of the multi-layer interconnection pattern, where the separation between the interconnection patterns is relatively not dense.

Japanese Laid-Open patent Application No. 14-526916 and Japanese Laid-Open patent Application No. 14-520849 discloses conventional techniques against the present invention.

SUMMARY OF THE INVENTION

Therefore, it is a general object of the present invention to provide a method for fabricating a novel and useful semiconductor device whereby the aforementioned problems are solved.

Another object of the present invention is to provide a method for fabricating a semiconductor device having a multi-layer interconnection structure being a structure in which a first interlayer insulation film with a small elastic modulus and a second interlayer insulation film with a large elastic modulus are stacked, wherein the generation of a crack in the second interlayer insulation film can be suppressed when the second interlayer insulation film is patterned by a photo-lithographic process using an antireflective film.

The present invention provides a method for fabricating a semiconductor device having a multi-layer interconnection structure with a first interlayer insulation film and a second interlayer insulation film that is formed on the first interlayer insulation film and has a hardness and an elastic modulus larger than those of the first interlayer insulation film, including a step of forming a resist film on the second interlayer insulation film via an antireflective film, a step of exposing to light and developing the resist film to form a resist pattern, and a step of patterning the antireflective film and the multi-layer interconnection structure using the resist pattern as a mask, wherein the antireflective film is includes a film with no stress or for storing compressive stress, in order to achieve the aforementioned object.

According to the present invention, in a semiconductor device having a multi-layer interconnection structure being a structure in which a second interlayer insulation film with a large hardness and an large elastic modulus is stacked on a first interlayer insulation film with a small hardness and a small elastic modulus, the concentration of tensile stress in the antireflective film and the problem of the generation of a crack caused thereby in the multi-layer interconnection structure can be avoided by forming the antireflective film as a film containing no tensile stress.

Particularly, the present invention is very useful for suppressing the generation of a crack in a multi-layer interconnection structure in an ultra-fine semiconductor device containing a fine pattern with a small radius of curvature.

BRIEF DESCRIPTION OF THE DRAWINGS

Other objects and features of the present invention will be apparent from the following detailed description of the present invention with referring to the drawings, in which.

DETAILED DESCRIPTION OF THE PREFERRED EMBODIMENTS

REFERENCE EXAMPLE

Figure 1:
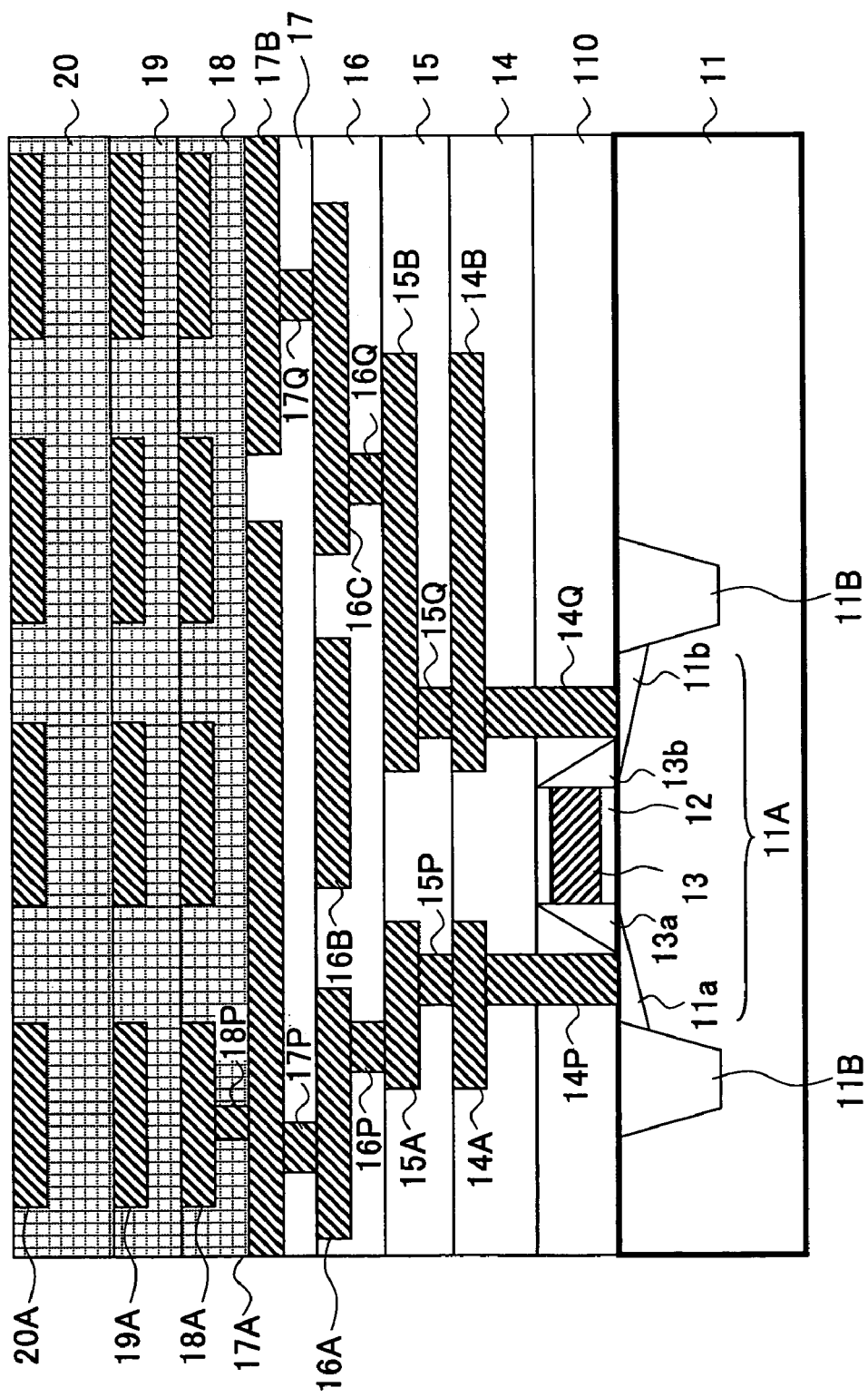
FIG. 1 is a drawing that illustrates the structure of a semiconductor device having a conventional multi-layer interconnection structure.

FIG. 1 illustrates the structure of a semiconductor device 10 having a conventionally typical multi-layer interconnection structure.

Referring to FIG. 1, the semiconductor device 10 includes a gate electrode 13 formed on an element area 11A compartmented by element separation structures 11B in a Si substrate 11 and via a gate insulation film 12 formed on the Si substrate, and a pair of diffusion areas 11a, 11b formed at both sides of the gate electrode 13.

The gate electrode 13 has sidewall surfaces covered with sidewall insulation films 13a, 13b. Further, an insulation film 110 that is typically made of a high-density plasma oxide film is formed on the substrate 11 so as to cover the gate electrode 13 and sidewall insulation films 13a, 13b.

On the insulation film 110, a low dielectric constant organic interlayer insulation film 14 commercially available from The Dow Chemical Company as a registered trademark SiLK therefor is formed and Cu interconnection patterns 14A, 14B are formed in the interlayer insulation film 14. The Cu interconnection patterns 14A, 14B are electrically connected to the diffusion areas 11a, 11b through contact plugs 14P, 14Q extending into the insulation film 110, respectively.

On the interlayer insulation film 14, a similar low dielectric constant organic interlayer insulation film 15 is formed and Cu interconnection patterns 15A, 15B are formed in the interlayer insulation film 15. The Cu interconnection patterns 15A, 15B are electrically connected to the interconnection patterns 14A, 14B through contact plugs 15P, 15Q, respectively.

The low dielectric constant interlayer insulation film 15 is covered with another low dielectric constant organic interlayer insulation film 16 formed on the interlayer insulation film 15. Moreover, yet another low dielectric constant organic interlayer insulation film 17 is formed on the interlayer insulting film 16.

In the illustrated example, Cu interconnection patterns 16A–16C are embedded in the interlayer insulation film 16 and Cu interconnection patterns 17A and 17B are embedded in the interlayer insulation film 17, wherein the interconnection patterns 16A and 16C are connected to the interconnection patterns 15A and 15B through via plugs 16P and 16Q, respectively, and the interconnection patterns 17A and 17B are connected to the interconnection patterns 16A and 16C through via plugs 17P and 17Q, respectively.

Further, in the illustrated example, SiOC interlayer insulation films 18, 19 and 20 are stacked on the interlayer insulation film 17 in order, and an interconnection pattern 18A made of Cu, an interconnection pattern 19A made of Cu, and an interconnection pattern 20A made of Cu are embedded in the interlayer insulation film 18, in the interlayer insulation film 19, and in the interlayer insulation film 20, respectively.

The interconnection patterns 19A and 20A are electrically connected to each other by a via plug, of which is omitted in the illustration, and the interconnection pattern 18A is connected to the interconnection pattern 17A through a via plug 18P.

In the illustrated example, since the Cu interconnection patterns 14A, 14B, 15A, 15B, 16A–16C, 17A, 17B, etc. are formed by means of a damascene method or a dual damascene method using a CMP process, the interlayer insulation films 14–17 are characterized by having a flat principal plane. The surface of the high-density plasma insulation film 110 is also treated by means of a CMP process so as to have a flat principal plane.

Meanwhile, in such a multi-layer interconnection structure, after fabricating the interlayer insulation films 14–17 and the corresponding interconnection patterns 14A, 14B, 15A, 15B, 16A–16C, 17A, and 17B, the SiOC film 18 is formed. Further, this is necessarily patterned, but a patterning process for such a SiOC film 18 is normally performed using a resist pattern as a mask, which resist pattern is formed by forming an antireflective film such as a SiN film on the SiOC film 18, exposing to light and developing a resist film applied thereon.

Figure 2:
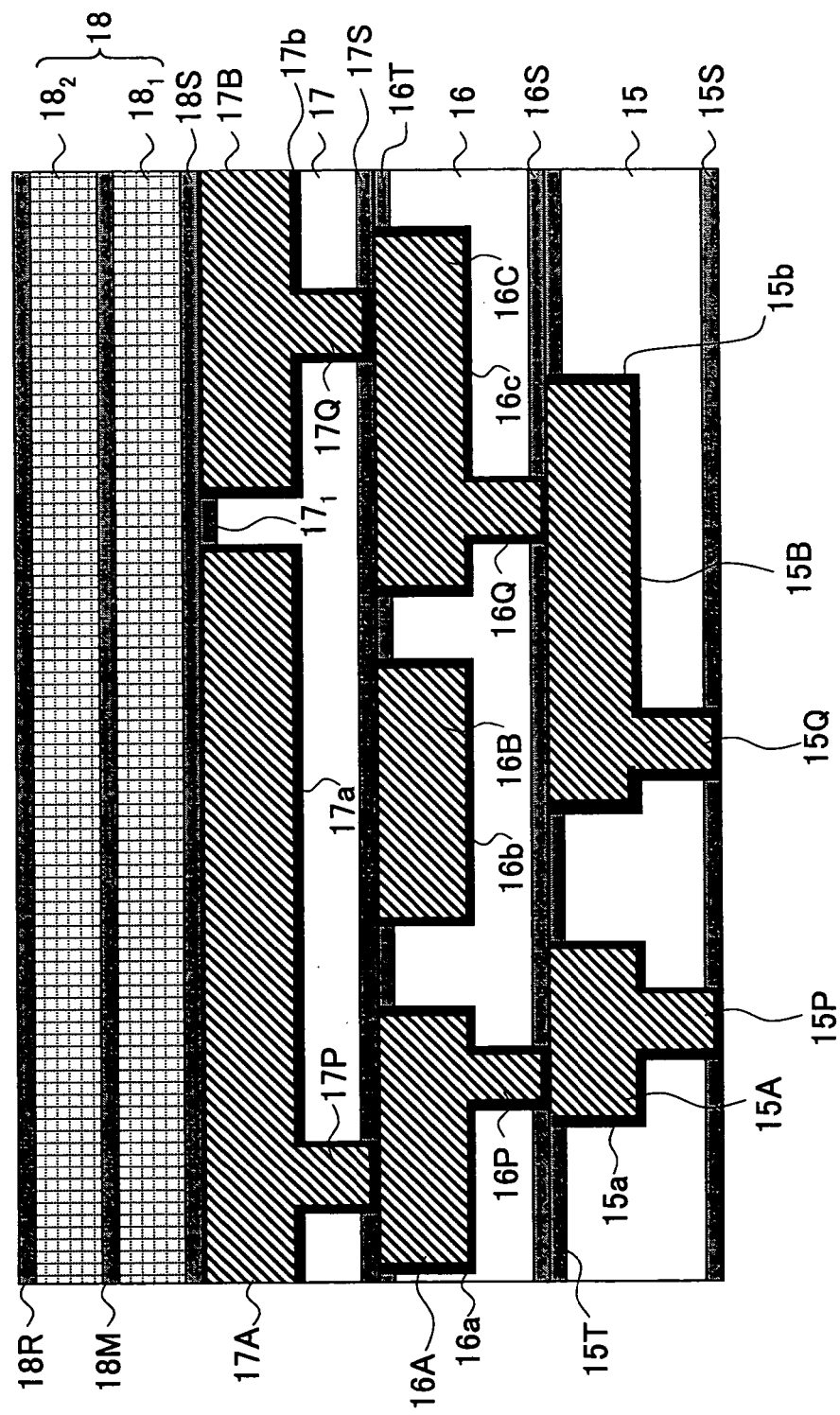
FIGS. 2–5 are drawings that indicate a process for forming a multi-layer interconnection structure in the semiconductor device illustrated in FIG. 1.
Figure 3:
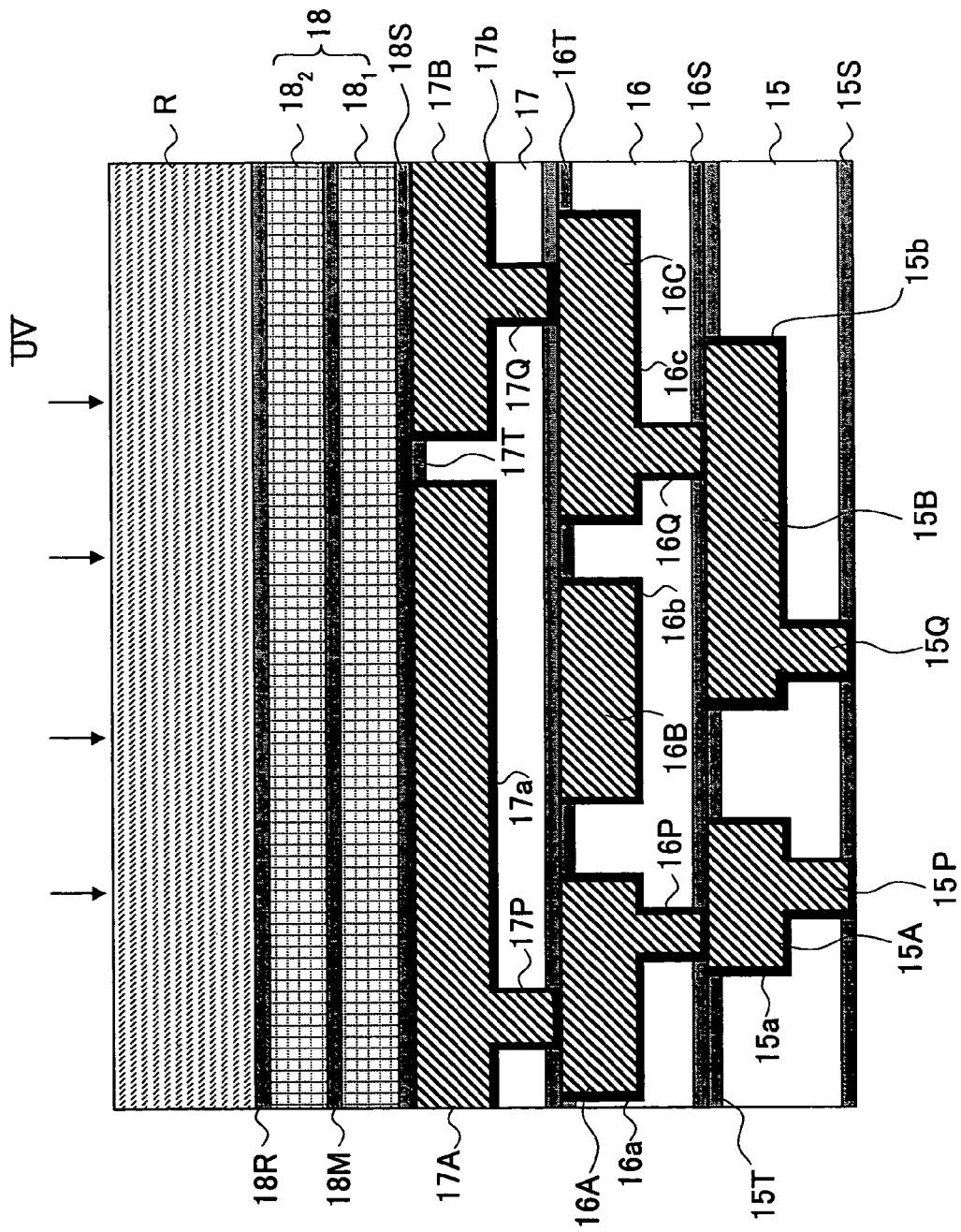
Figure 4:
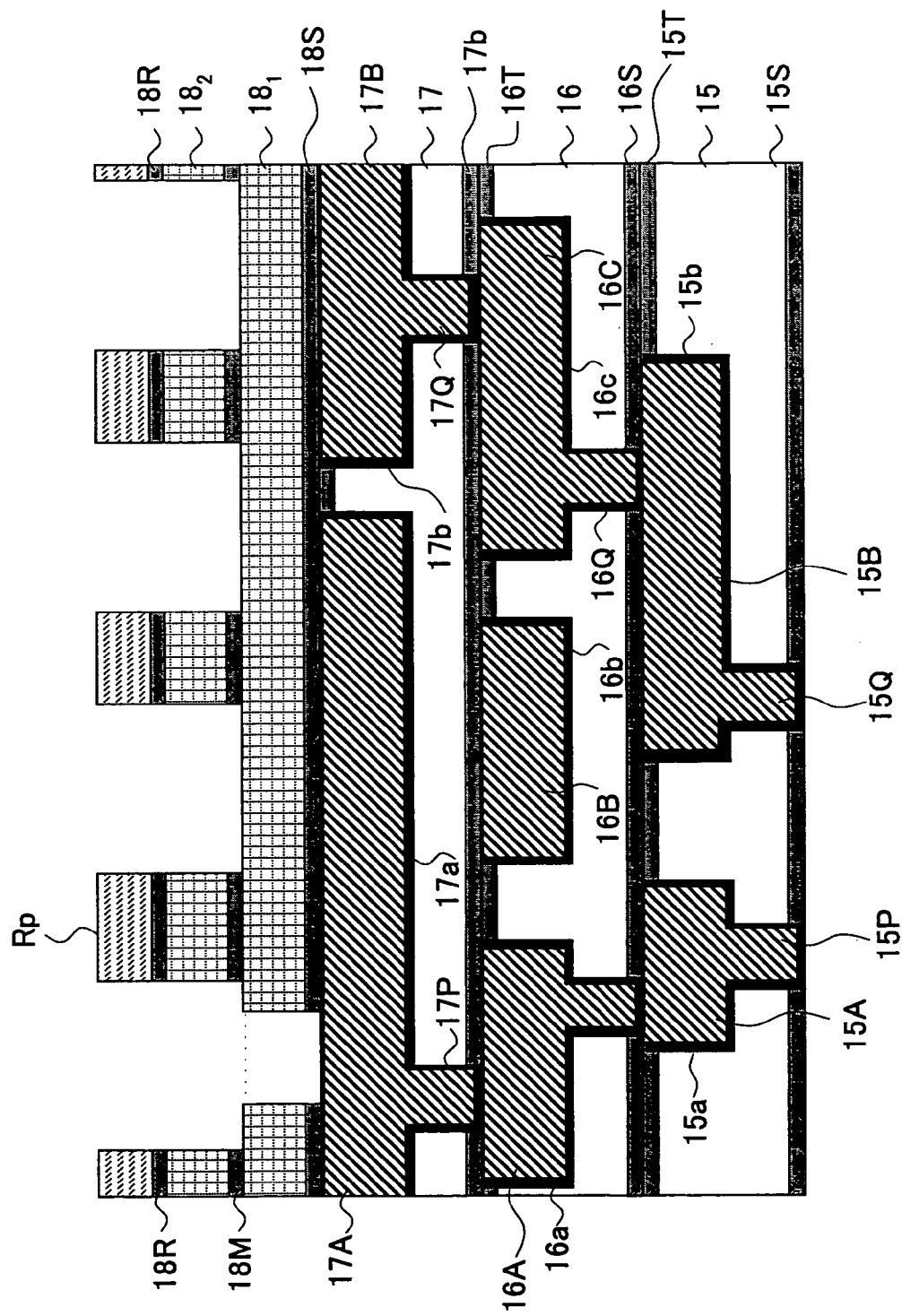

FIGS. 2–4 illustrate an example of a patterning process for such a SiOC film. Herein, the process indicated in FIGS. 2–4 corresponds to the structure illustrated in FIG. 1. In the following description, for the simplicity of explanation, the interlayer insulation film 14 and the parts thereunder are omitted in a cross-sectional view of the multi-layer interconnection structure.

Referring to FIG. 2, the interlayer insulation films 15–17 include, thereon and thereunder, barrier films 15S and 15T, 16S and 16T, and 17S and 17T, respectively, which are made of SiN, SiC, or the like, and Cu interconnection patterns 15A, 15B, 16A–16C, 17A, and 17B are covered with barrier metal films 15a, 15b, 16a–16c, 17a, and 17b, respectively, which are made of TaN, TiN, or the like. Also, the SiOC film 18 is composed of a lower layer $18_1$ and an upper layer $18_2$ divided by an etching stopper film 18M being a SiN film or a SiC film, and an etching stopper film 18S made of SiN or SiC is formed under the lower layer $18_1$.

Also, still referring to FIG. 2, a SiN antireflective film 18R with a thickness of approximately 50 nm is formed on the upper SiOC film $18_2$.

The structure illustrated in FIG. 2 is further introduced into a spin-coating apparatus in a process indicated in FIG. 3 and a resist film R is formed on the antireflective film 18R by means of a spin-coating method.

Furthermore, the resist film R is exposed to light and developed in the process indicated in FIG. 3. In the process indicated in FIG. 4, the antireflective film 18R, the SiOC film $18_2$ and the etching stopper film 18M thereunder, and further the SiOC film $18_1$ are patterned using as a mask a resist pattern Rp formed as a result of the light exposure and development process, so that an interconnection channel 18a corresponding to the interconnection pattern 18A in the SiOC film $18_2$ and a via hole 18p in the SiOC film $18_1$ are formed.

Figure 5:
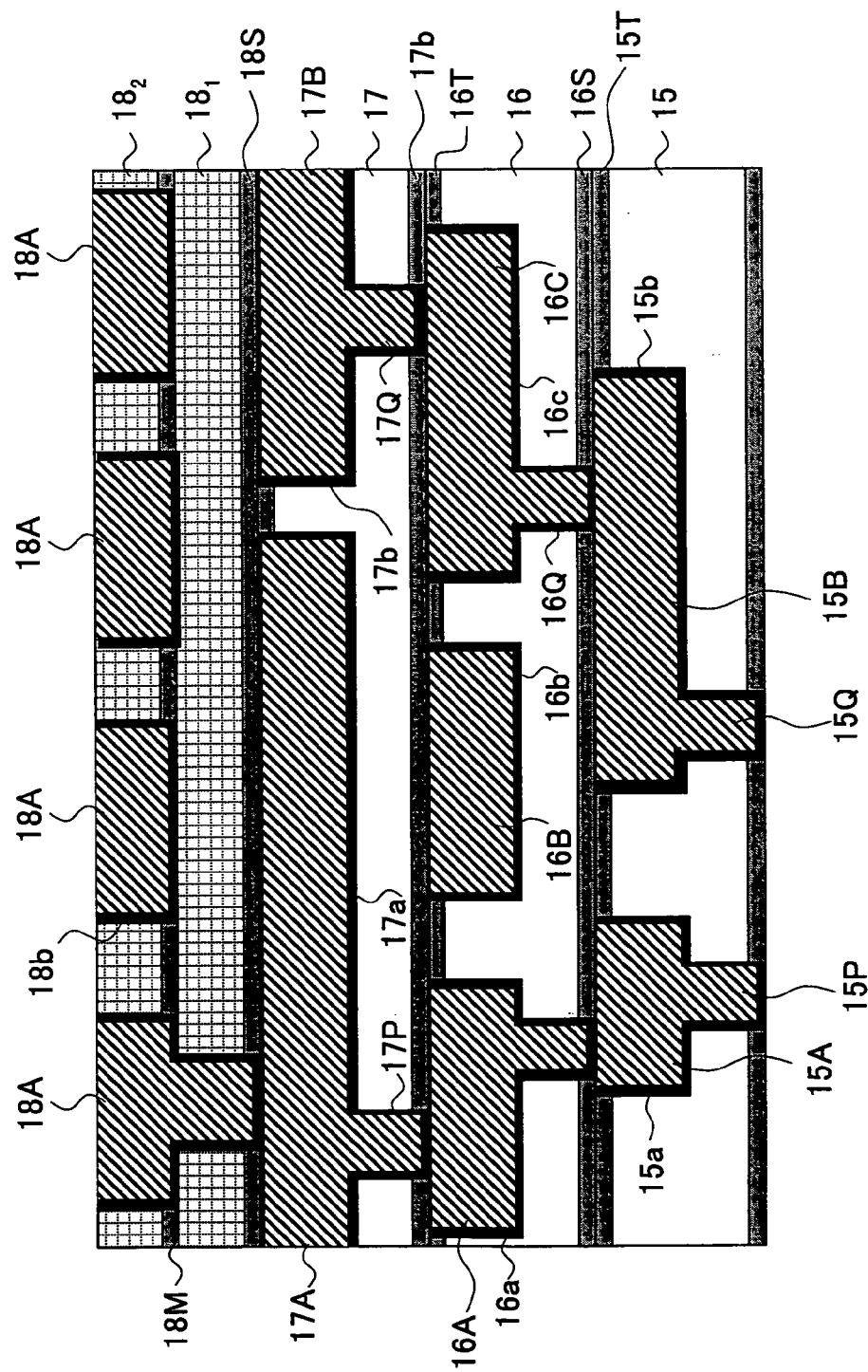

Moreover, in the process indicated in FIG. 5, an electrically conductive layer such as Cu is deposited on the structure illustrated in FIG. 4 via a barrier metal film 18B such as TaN. Further, it is polished and eliminated by means of a CMP method. Thus, a multi-layer interconnection structure is obtained, in which the interconnection channel 18a is filled with the interconnection pattern 18A and further the via hole 18p is filled by the via plug 18P. Similar processes are repeated for the interlayer insulation films 19 and 20.

Figure 6:
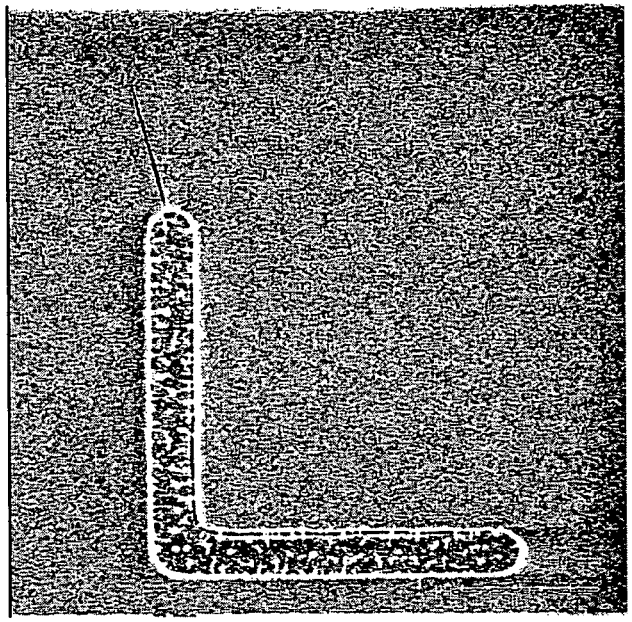
FIGS. 6–7 are drawings that illustrate a problem occurred in the semiconductor device illustrated in FIG. 1.
Figure 7:
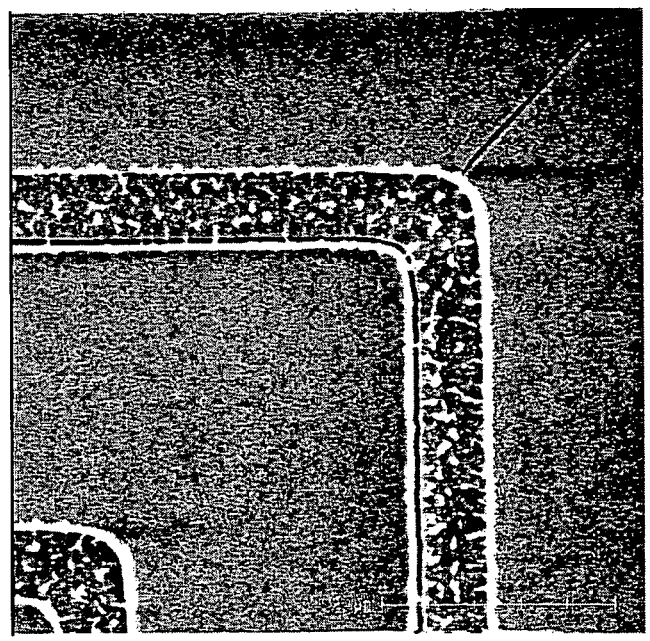

On the other hand, the inventor of the present invention found that a crack may be generated in the SiN antireflection film 18R at a portion at which stress concentration is easily caused, such as a tip portion or a curved portion, etc. of a pattern, as illustrated in FIG. 6 or 7. It occurs in a process for fabricating a hybrid-type multi-layer interconnection structure having a characteristic dynamical structure that has a small elastic constant in the lower part composed of low dielectric constant interlayer insulation films 14–17 such as SiLK and a large elastic constant in the upper part composed of SiOC film 18, as illustrated in FIGS. 2–5. Particularly, it occurs when the SiN antireflection film 18R is patterned in the process indicated in FIG. 4. Herein, FIG. 6 illustrates an example of a crack that generated at a tip portion of an L-shaped pattern and FIG. 7 shows an example of a crack that generated at a curved portion of a humidity-resistant ring pattern. In FIG. 6 or 7, the crack generates in the antireflection film 18R but extends into the SiOC film 18 thereunder, and further, it is considered that there is a possibility of perforating into the low dielectric constant films 15–17 thereunder.

It was observed that the result of FIG. 6 occurred in 8 patterns among 11 test patterns and the result of FIG. 7 occurred in 1 pattern among 11 test patterns.

[Principle]

From FIGS. 6 and 7, since a crack generates at a portion at which stress concentration is easily caused, the inventor of the present invention carried out stress analysis with respect to a multi-layer interconnection structure similar to FIG. 1 on a study that is a basis of the present invention.

Figure 8:
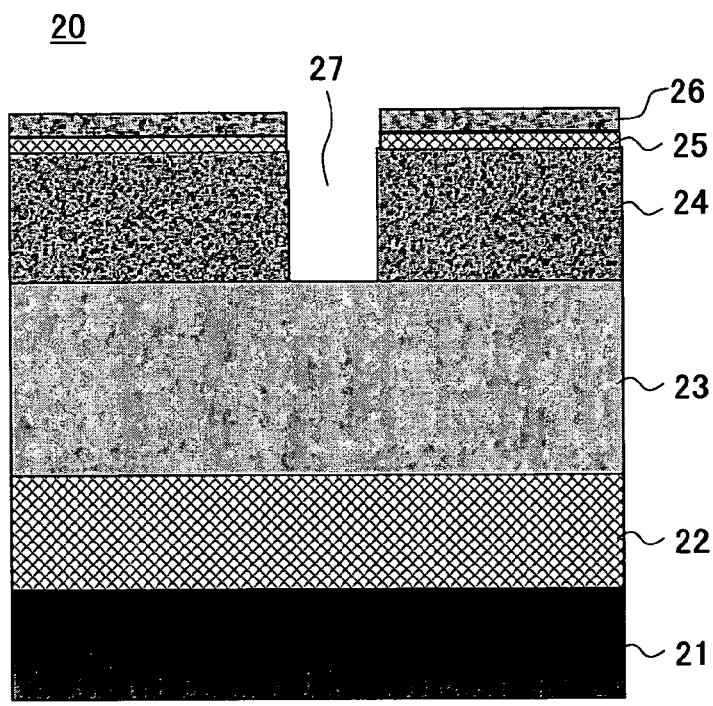
FIGS. 8–13 are drawings that illustrate the principle of the present invention.
Figure 9:
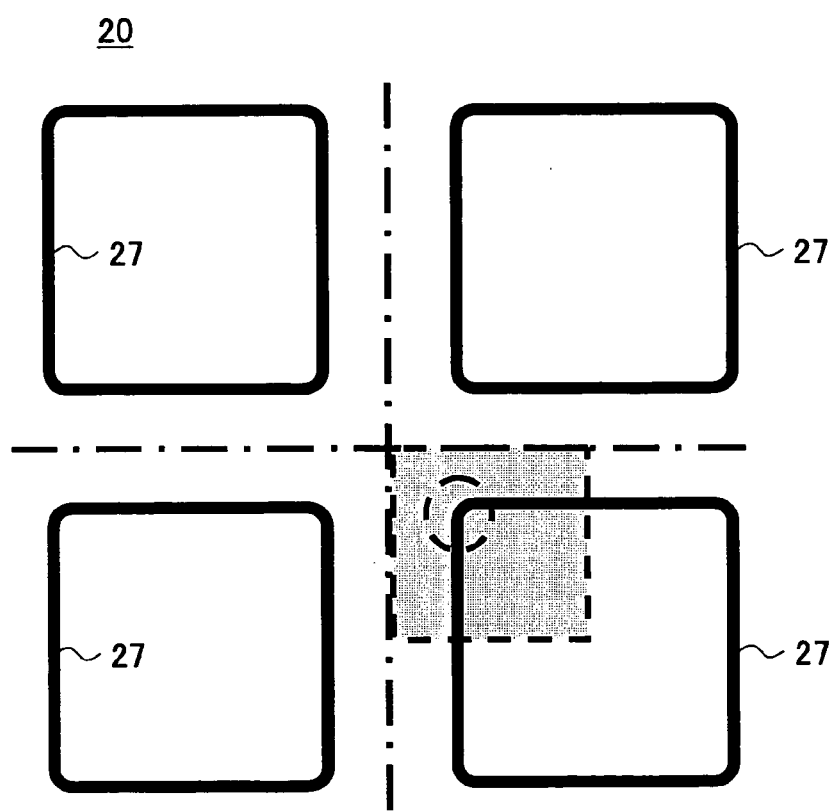
Figure 10:
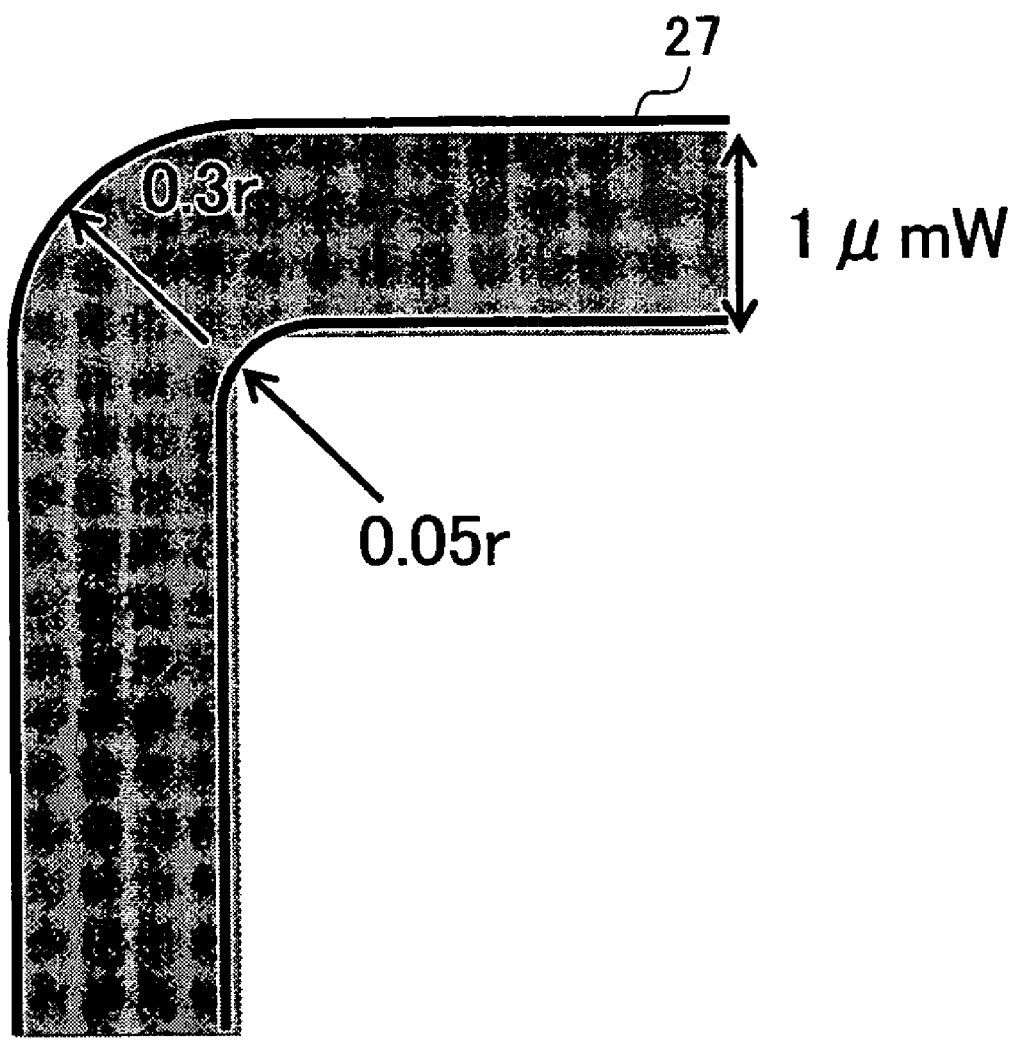

FIGS. 8–10 illustrate a model structure 20 used for this stress analysis.

Referring to FIG. 8, a model structure is used in the stress analysis which is obtained by forming an organic insulation film 23 made of an aromatic hydrocarbon polymer (a registered trademark for The Dow Chemical Company: SiLK) with a thickness of 2,200 nm on a Si substrate 21 via a $SiO_2$ film 22 with a thickness of 1,000 nm, forming a SiOC film 24 with a thickness of 800 nm on the organic insulation film 23, then forming a $SiO_2$ film 25 with a thickness of 30 nm on the SiOC film 24, and forming a SiN film 26 with a thickness of 50 nm on the $SiO_2$ film 25. Herein, as the SiN film 26, a film with a refractive index n of 2.25 and an attenuation constant k of 1.75 is used, which is conventionally used as an antireflective film. Also, the value of tensile stress stored in the SiN antireflective film 26 is 0.5 GPa in the model structure.

FIG. 9 is a drawing that illustrates model patterns 27 formed on the model structure and FIG. 10 is a drawing that illustrates a circled and magnified corner portion among the portions of the model pattern illustrated in FIG. 9.

Referring to FIG. 9, the model patterns correspond to humidity-resistant ring patterns that are formed regularly and repeatedly corresponding to respective chips on a silicon wafer and the model pattern piece has a length of 10 μm and a width of 1 μm. As illustrated in FIG. 8, the model patterns perforate the SiN film 26 and the $SiO_2$ film 25 thereunder and reach the SiOC film 24.

Also, referring to FIG. 10, the model pattern has radii of curvature of 0.3 μm at the outer side of the corner portion and 0.05 μm at the inner side.

Figure 11:
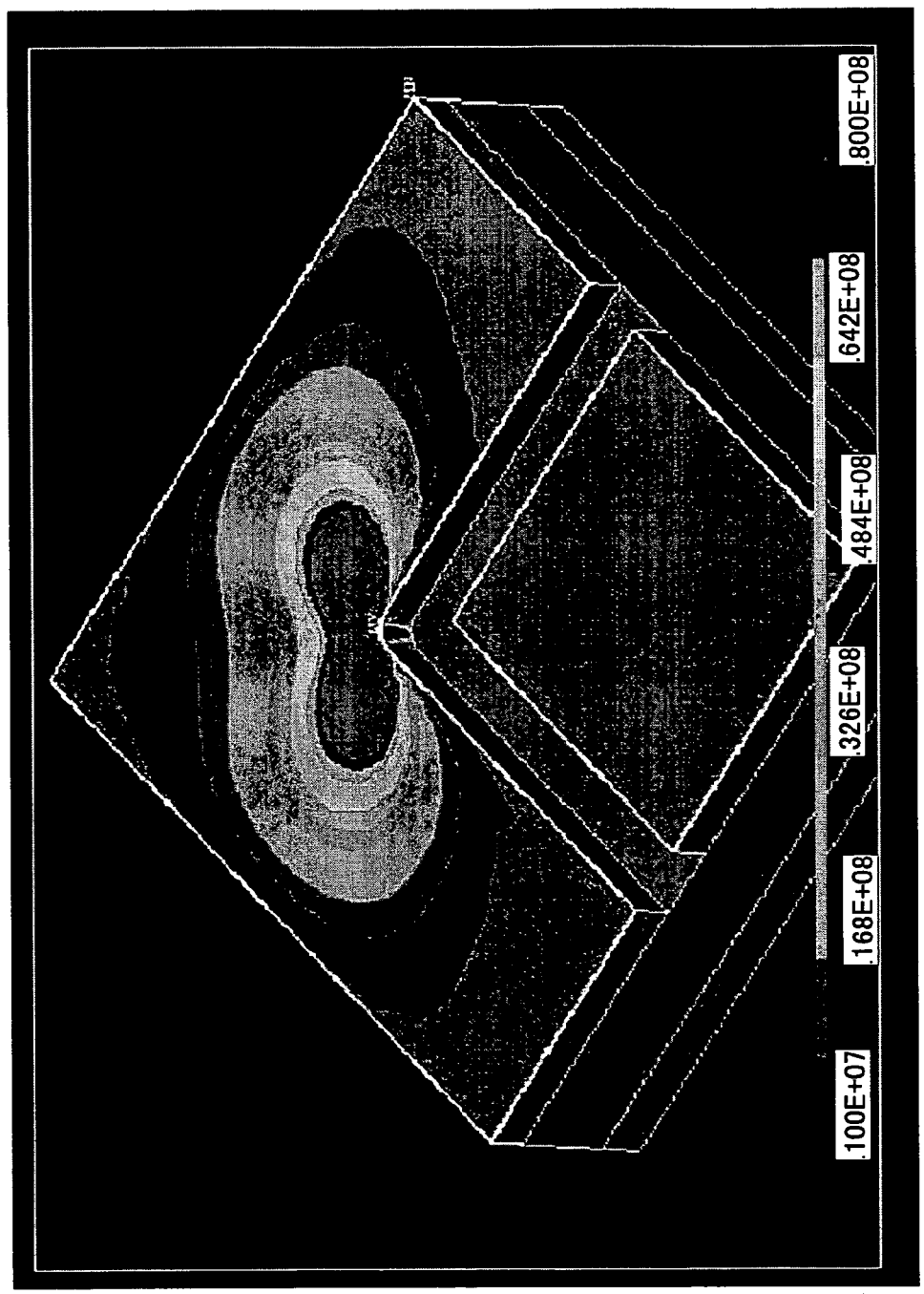

FIG. 11 illustrates the result of the stress analysis carried out with respect to such a model structure. Herein, in this stress analysis, it is assumed that the organic insulation film 23 has a hardness of 0.27 GPa and an elastic modulus of 3.6 GPa and the SiOC film 24 has a hardness of 3.6 GPa and an elastic modulus of 23.6 GPa.

Referring to FIG. 11, it is understood that the significant concentration of tensile stress occurs at the corner portion illustrated in FIG. 10.

Figure 12:
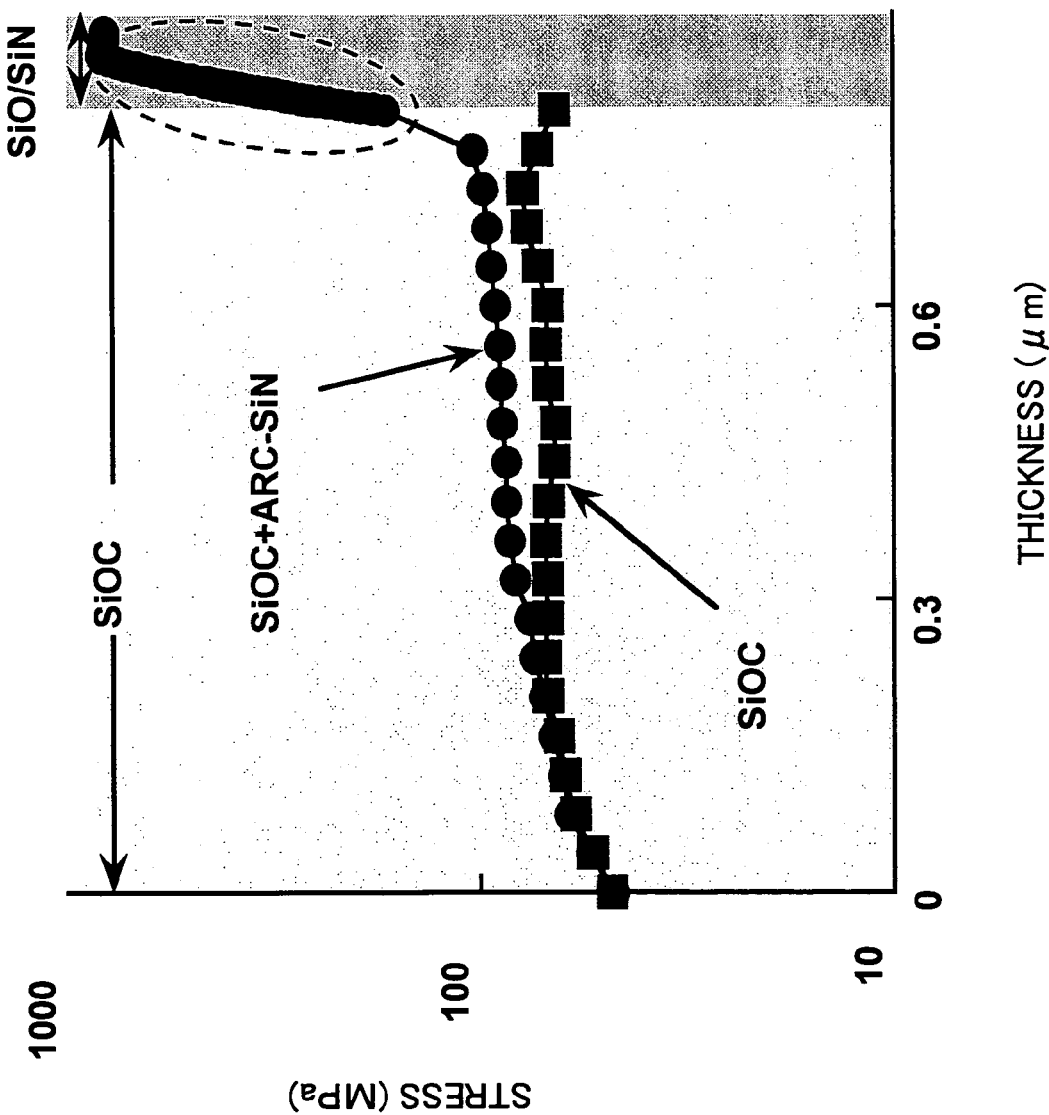

FIG. 12 illustrates a tensile stress distribution along the direction of depth, which is obtained by the stress analysis illustrated in FIG. 11.

Referring to FIG. 12, it is apparent that the greatly significant concentration of tensile stress occurs in the $SiO_2$ film 25 and the SiN antireflective film 26 in the model structure 20 illustrated in FIG. 8.

Generally, it is known that a SiN film used for an antireflective film is formed on the condition of satisfying a requirement for optical properties such as a refractive index n, an attenuation constant k, etc., and stores strong tensile stress that is greater than 0.1 Gpa and reaches 0.5 Gpa. Accordingly, it is considered that the concentration of tensile stress is caused due to the presence of the SiN antireflective film 26 in the model structure 20 illustrated in FIG. 8 in which the SiOC film 24 with a larger hardness and a larger elastic modulus is stacked on the organic insulation film 23. Also, it is considered that a crack generating in the SiN antireflective film 26 and the $SiO_2$ film 25 thereunder reaches the SiOC film 24 thereunder due to such stress concentration.

Figure 13:
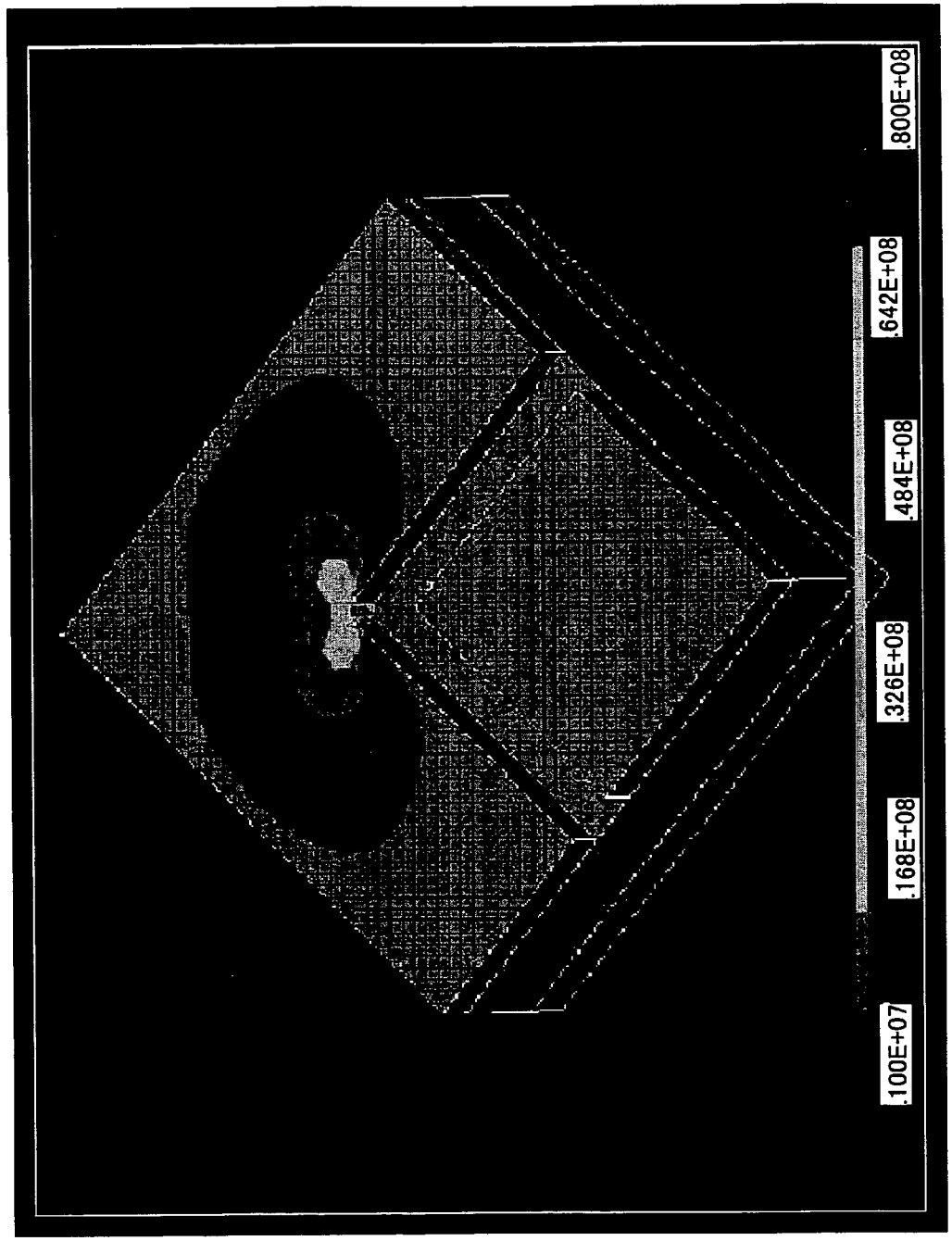

On the other hand, the result of stress analysis in case that the SiN antireflective film 26 is eliminated in the model structure 20 illustrated in FIG. 8 is illustrated in FIG. 13.

In accordance with an expectation, the stress concentration in the $SiO_2$ film 25 is significantly reduced with respect to the result illustrated in FIG. 13.

Accordingly, the concentration of tensile stress in the SiN antireflective film 26 is prevented by forming the SiN antireflective film 26 as a no-stress film or a compressive stress film in the present invention and, thus, the problem of the generation of a crack as illustrated in FIGS. 6 and 7 may be avoided.

[The First Embodiment]

FIGS. 14–17 indicate a process for fabricating a semiconductor device 40 according to one embodiment of the present invention. Herein, the same reference numeral is assigned to a part corresponding to a previously described part in the figures, the description of which is omitted.

Figure 14:
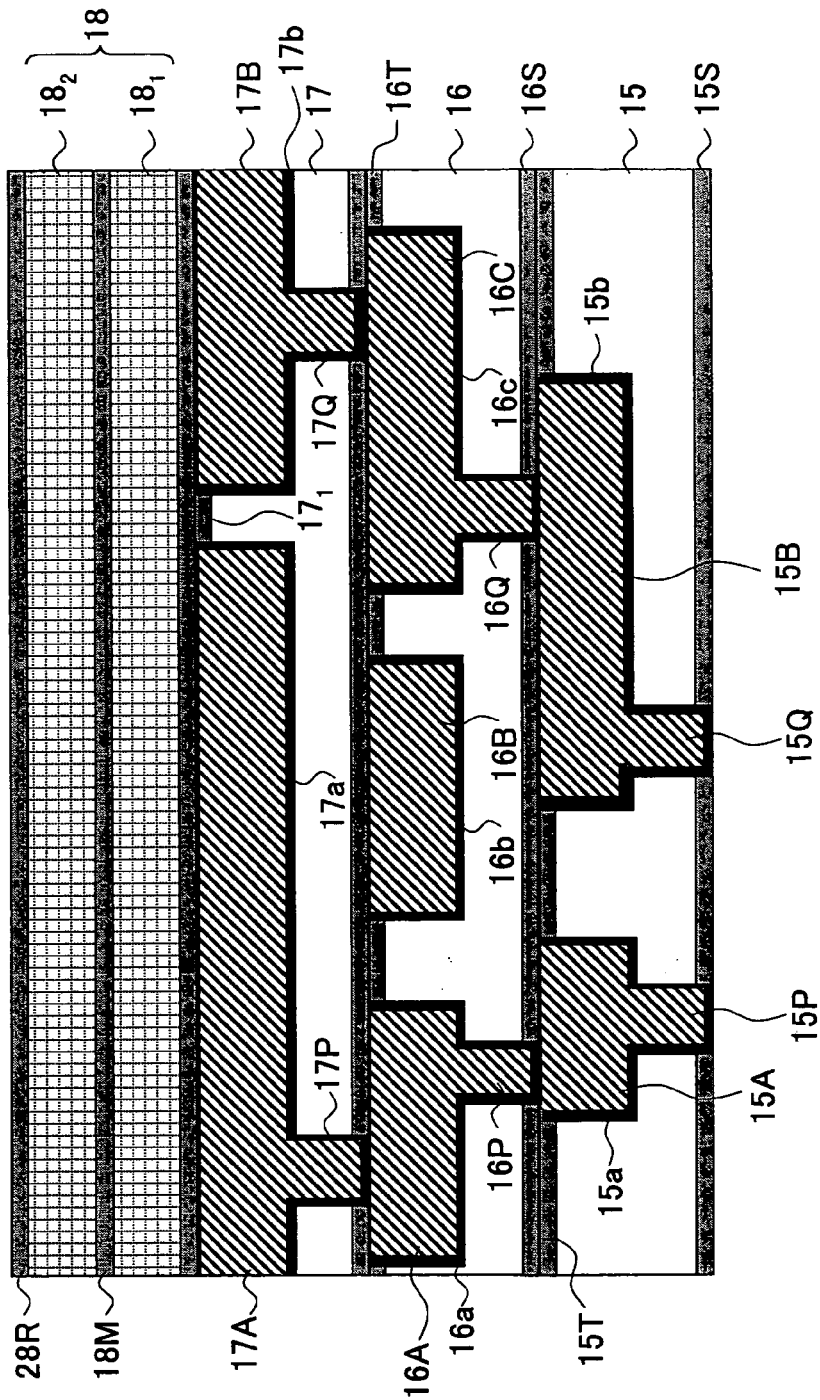
FIGS. 14–17 are drawings that indicate a process for forming a multi-layer interconnection structure according to one embodiment of the present invention.

Referring to FIG. 14, the SiN antireflective film 18R that stores strong tensile stress is replaced by a SiN antireflective film 28R that stores compressive stress or no stress in the present embodiment.

A process for forming the SiN antireflective film 28R is described below.

Figure 18:
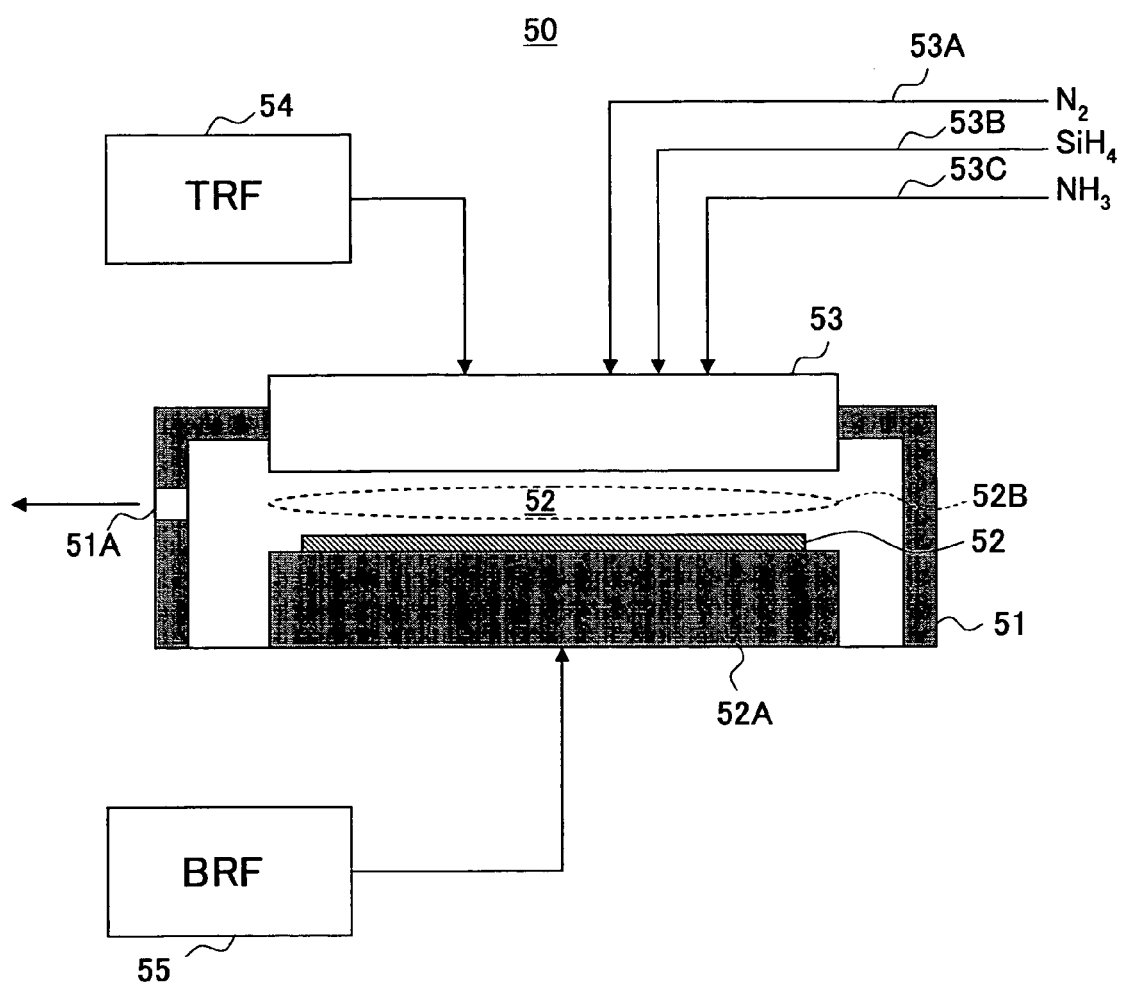
FIG. 18 is a drawing that illustrates the structure of a plasma CVD apparatus used for the present invention.

In the present embodiment, the multi-layer structure illustrated in FIG. 2 is introduced into a plasma CVD apparatus 50 illustrated in FIG. 18 before the resist film R is formed, then a Si material gas such as silane and a nitrogen-containing gas such as $NH_3$ are fed, and the SiN antireflective film 28R is formed on the SiOC interlayer insulation film 18 on the condition of storing no tensile stress in the film.

Referring to FIG. 18, the plasma CVD apparatus 50 is equipped with a process container 51 with an evacuation port 51A at which evacuation is performed and a substrate supporting table 52A for supporting a substrate to be processed 52 is provided in the process container 51.

On the top of the process container 51, a shower head 53 is provided so as to oppose the substrate to be processed 52 on the substrate supporting table 52A. A nitrogen gas, a Si material gas such as silane ($SiH_4$), and a nitrogen-containing gas such as ammonia ($NH_3$) are fed through lines 53A, 53B, and 53C to the shower head 53, respectively. The fed gases are released from a number of apertures provided on the lower surface of the shower head 53 to a process space between the shower head 53 and the substrate to be processed 52.

The shower head 53 is further coupled to a high frequency power supply 54 for a frequency of 13.56 MHz via an impedance matching device, of which the illustration is omitted, and plasma 52B is created in the process space by driving the high frequency power supply 54.

In the illustrated plasma CVD apparatus 50, the substrate supporting table 52A is further coupled to another RF power supply 55 that operates at a frequency of approximately 450 kHz.

In the plasma CVD apparatus 50 illustrated in FIG. 18, an electric field is created in a space in the neighborhood of the surface of the substrate to be processed 52 by supplying a high frequency electric power with a frequency of approximately 450 kHz from the aforementioned another RF power supply 55 to the substrate to be processed 52. The value of stress stored in the SiN antireflective film 28 formed on the surface of the substrate to be processed 52 can be controlled by controlling the strength of the electric field dependent on the high frequency electric power.

Figure 19:
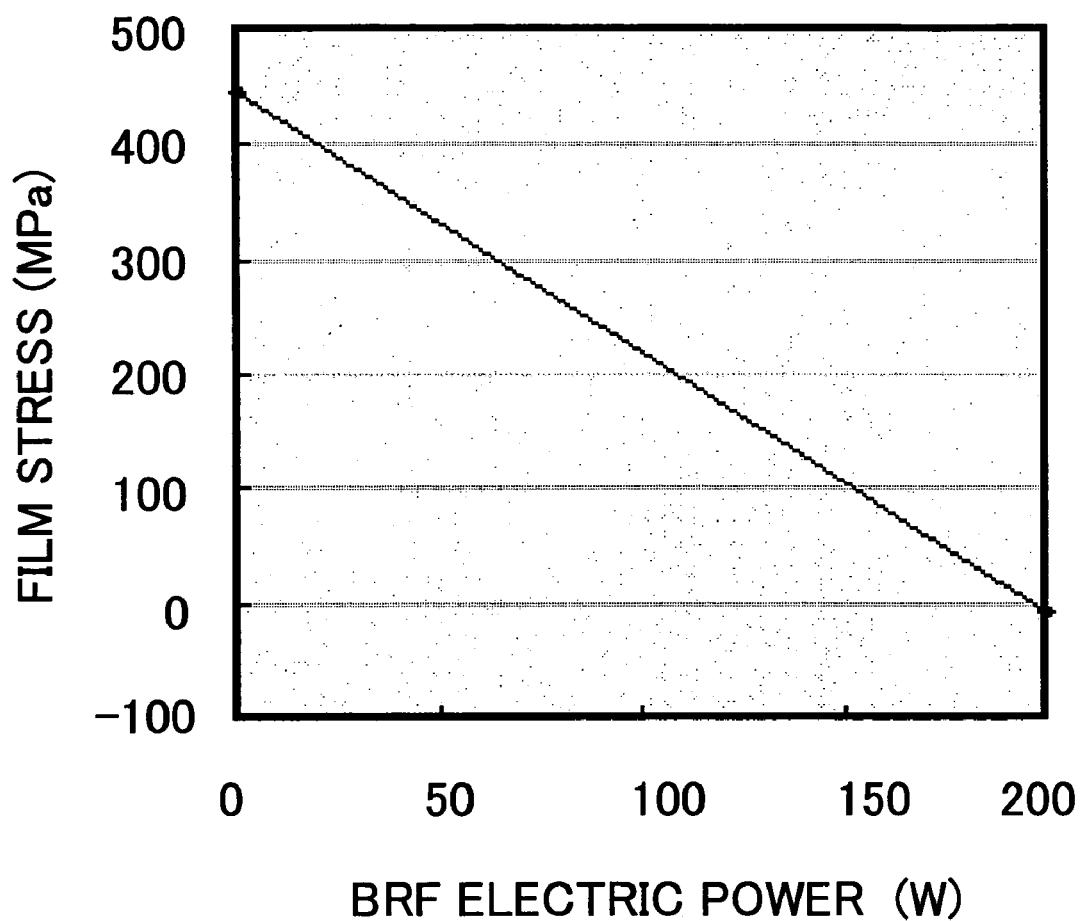
FIGS. 19 and 20 are drawings that illustrate examples of film stress in a SiN antireflective film formed by using the plasma CVD apparatus illustrated in FIG. 18.

FIG. 19 illustrates the value of stress stored in the formed SiN antireflective film 28R when the SiN antireflective film 28R is formed in the process space 52B in the plasma CVD apparatus 50 by feeding a silane gas with a flow rate of 970 SCCM, a nitrogen gas with a flow rate of 6 SLM, and an $NH_3$ gas with a flow rate of 1 SLM at a pressure of 2.6 Torr and at a substrate temperature of 400° C. as shown in the following table 1 and supplying a high frequency electric power with a frequency of 13.56 MHz and a power of 300 W from the RF power supply 54. Then, a high frequency electric power with a frequency of 450 kHz supplied from the RF power supply 55 to the substrate supporting table 52A, consequently, to the substrate to be processed 52, is variously changed. Herein, a positive stress value indicates tensile stress and a negative stress value indicates compressive stress in FIG. 19.

TABLE 1

| | |
|---|---|
| $SiH_4$ = | 970 SCCM |
| $NH_3$ = | 1 SLM |
| $N_2$ = | 6 SLM |
| Process pressure = | 2.6 Torr |
| HFRF = | 300 W |
| Temp. = | 400° C. |

Referring to FIG. 19, the stress stored in the formed SiN antireflective film 28R is greatly changed dependent on the RF electric power supplied from the power supply 55 to the substrate 52 and when the RF electric power is zero, a film with very strong tensile stress of approximately 400 MPa is formed, but the film stress is drastically reduced by increasing the RF electric power. For example, the film stress can be substantially controlled to zero by setting the RF electric power of the power supply 55 to be 200 W. As the RF electric power is increased over 200 W, compressive stress should be stored in the film.

Figure 20:
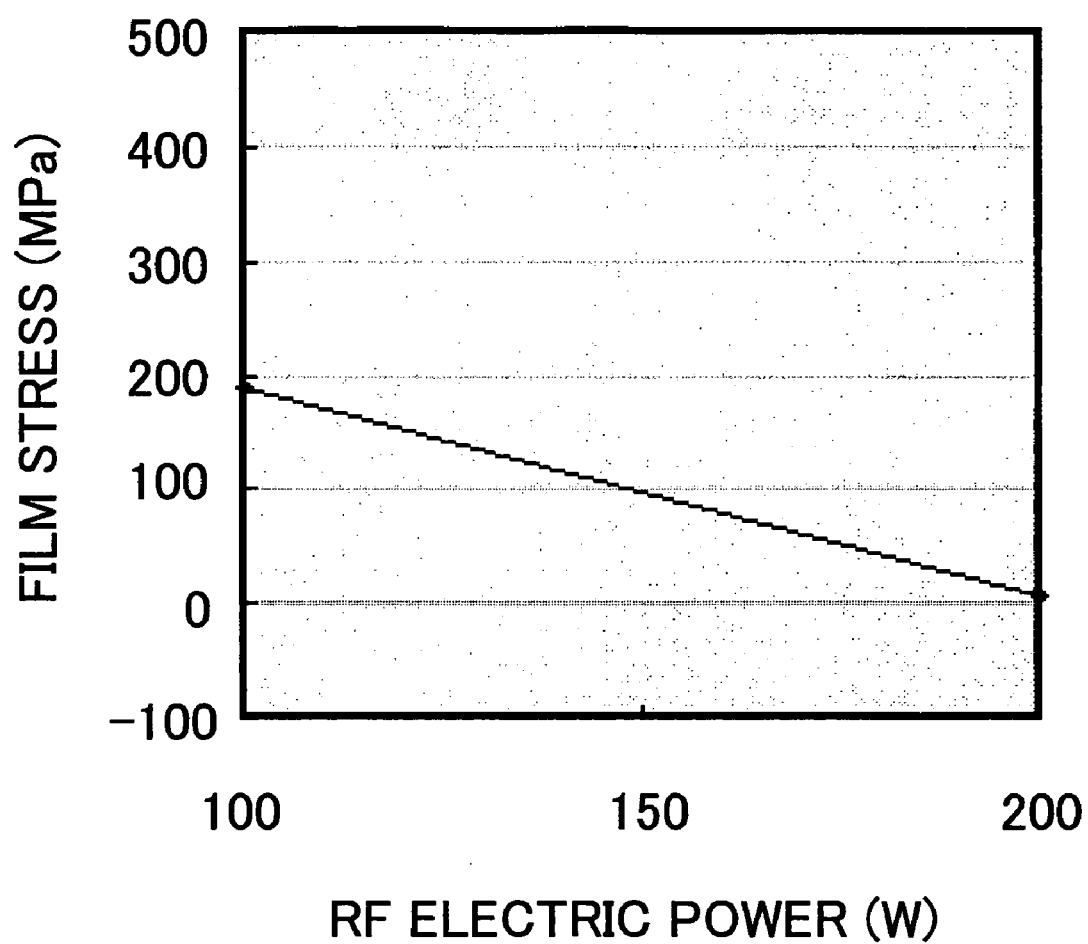

FIG. 20 illustrates the value of stress stored in the formed SiN antireflective film 28R when the SiN antireflective film 28R is formed in the process space 52B in the plasma CVD apparatus 50 by feeding a silane gas with a flow rate of 970 SCCM, a nitrogen gas with a flow rate of 1 SLM, and an $NH_3$ gas with a flow rate of 1 SLM at a pressure of 2.6 Torr and at a substrate temperature of 400° C. as shown in the following table 2 and supplying a high frequency electric power with a frequency of 13.56 MHz and a power of 300 W from the RF power supply 54. Then, a high frequency electric power with a frequency of 450 kHz supplied from the RF power supply 55 to the substrate supporting table 52A, consequently, to the substrate to be processed 52, is changed similar to the case of FIG. 19. Herein, a positive stress value indicates tensile stress and a negative stress value indicates compressive stress in FIG. 20.

TABLE 2

| | |
|---|---|
| $SiH_4$ = | 970 SCCM |
| $NH_3$ = | 1 SLM |
| $N_2$ = | 1 SLM |
| Process pressure = | 2.6 Torr |
| HFRF = | 300 W |
| Temp. = | 400° C. |

Referring to FIG. 20, the stress stored in the formed SiN antireflective film 28R is greatly changed dependent on the RF electric power supplied from the power supply 55 to the substrate 52 and when the RF electric power indicates a small value of the order of 100 W, a film having strong tensile stress of approximately 200 MPa is formed, but the film stress is drastically reduced by increasing the RF electric power. For example, the film stress can be substantially controlled to zero by setting the RF electric power to be 200 W. As the RF electric power is increased over 200 W, compressive stress should be stored in the film.

When the RF electric power applied to the substrate to be processed 52 in the plasma CVD apparatus 50 illustrated in FIG. 18 is set to be zero, it has been confirmed that only a film having very strong tensile stress as described above can be obtained as the SiN antireflective film 28R and, in this case, the tensile stress on the film cannot be effectively reduced even though other various parameters such as the flow rates and process pressures of the process gasses, the substrate temperature, the plasma electric power, and the space between the substrate 52 and the shower head 53 are changed.

Thus obtained SiN film having compressive stress or no stress has optical properties to function as an antireflective film, that is, a refractive index of 2.25 and an attenuation constant of 1.75. The antireflective film is generally formed so as to have a film thickness on the order of approximately 50 nm.

Figure 15:
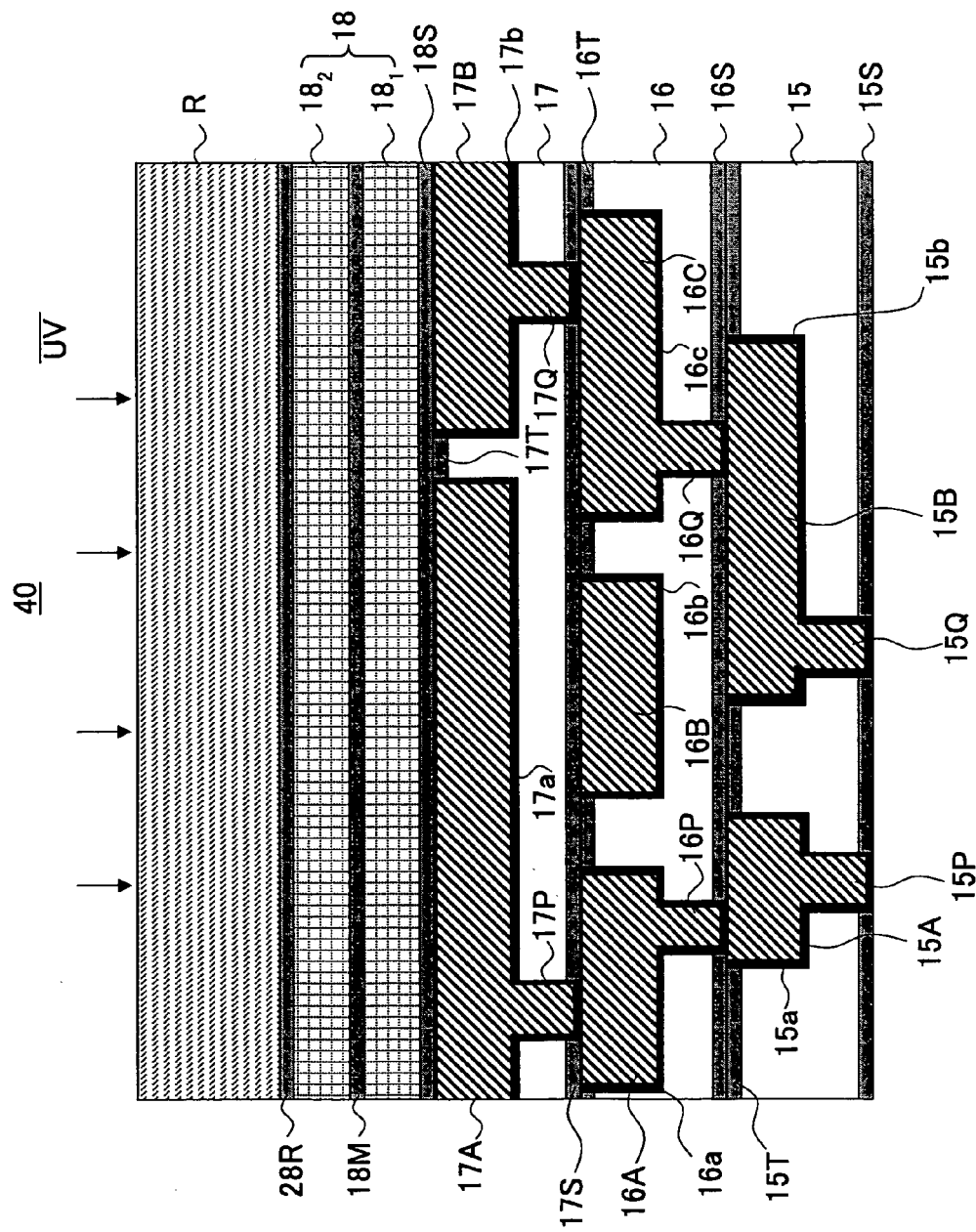
Figure 16:
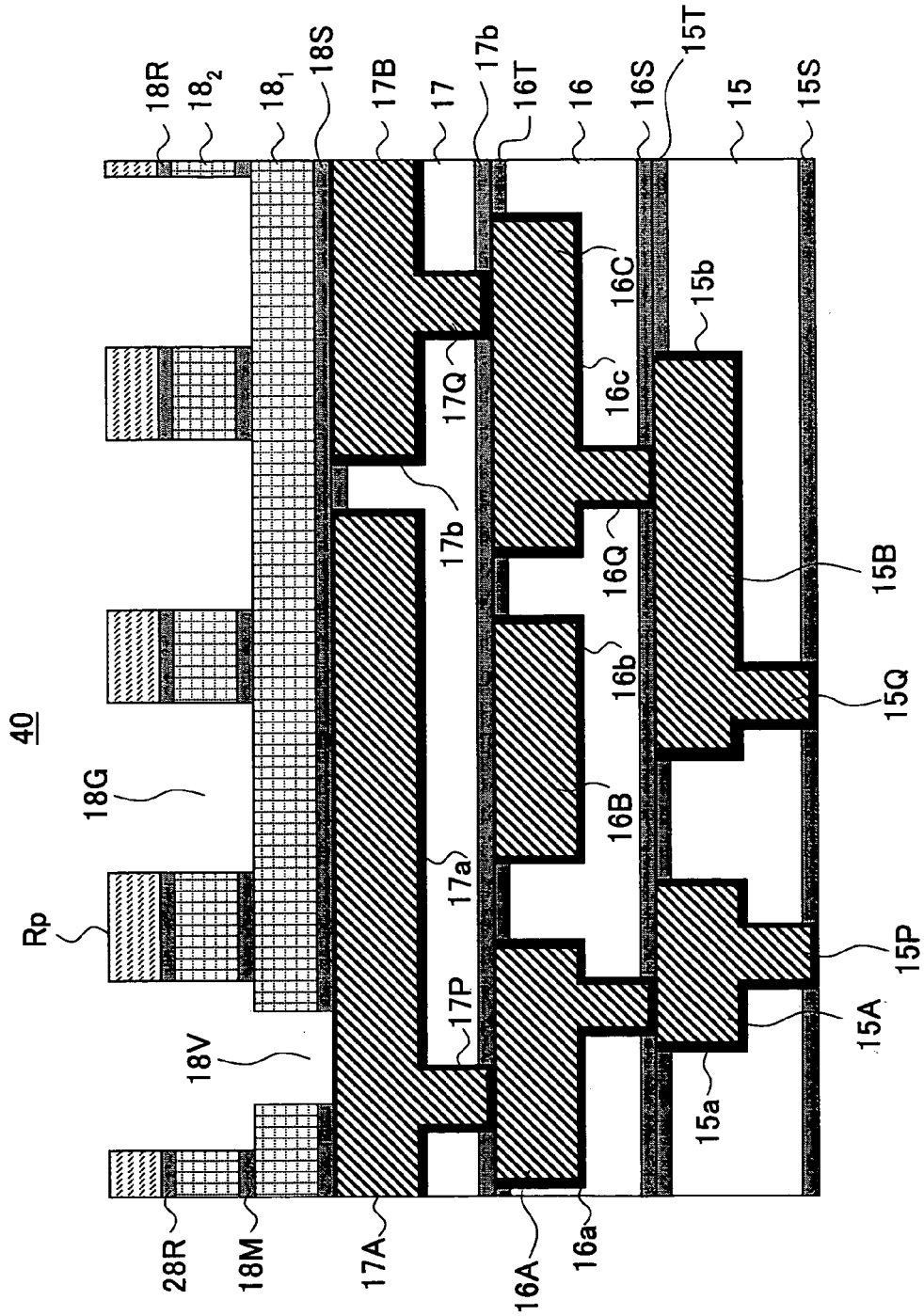

Therefore, where a resist film R is formed on the antireflective film 28R in the process illustrated in FIG. 15 and this is further exposed to light and developed, reflected light from the side of the substrate is effectively cut due to the effect of the antireflective film 28R and a via hole 18V or an interconnection channel 18G can be formed with high precision in the process indicated in FIG. 16. At this time, since the antireflective film 28R is a no-stress film or a compressive stress film, a crack caused by the stress concentration in the film 28R does not generate when the via hole 18V or the interconnection channel 18G is patterned. Therefore, the crack does not reach the SiOC film $18_1$ or $18_2$ under the film 28R.

Figure 21:
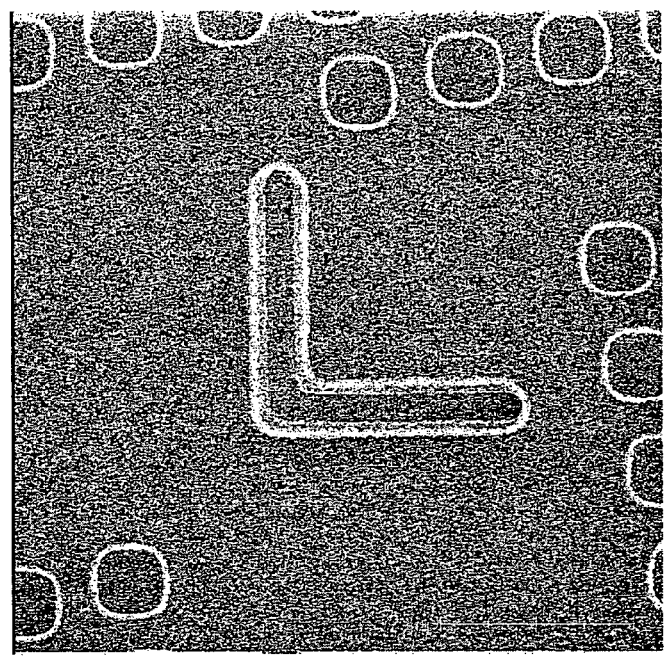
FIGS. 21 and 22 are drawings that illustrate examples of a pattern formed in a multi-layer interconnection structure according to one embodiment of the present invention.
Figure 22:
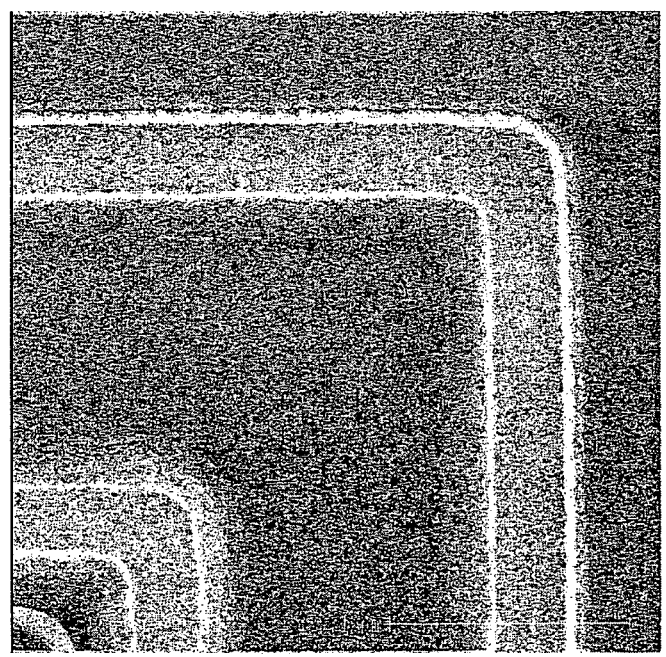

FIG. 21 illustrates an example of an L-shaped pattern formed according to the present embodiment and FIG. 22 illustrates an example of a humidity-resistant ring pattern formed according to the present embodiment. The pattern illustrated in FIG. 21 has the same dimension and shape as those of the previously described pattern illustrated in FIG.

6, and the pattern illustrated in FIG. 22 has the same dimension and shape as those of the previously described pattern illustrated in FIG. 7.

As seen in FIGS. 21 and 22, no crack generates in any of these patterns. Similar results were obtained with respect to all of 14 test patterns.

Figure 17:
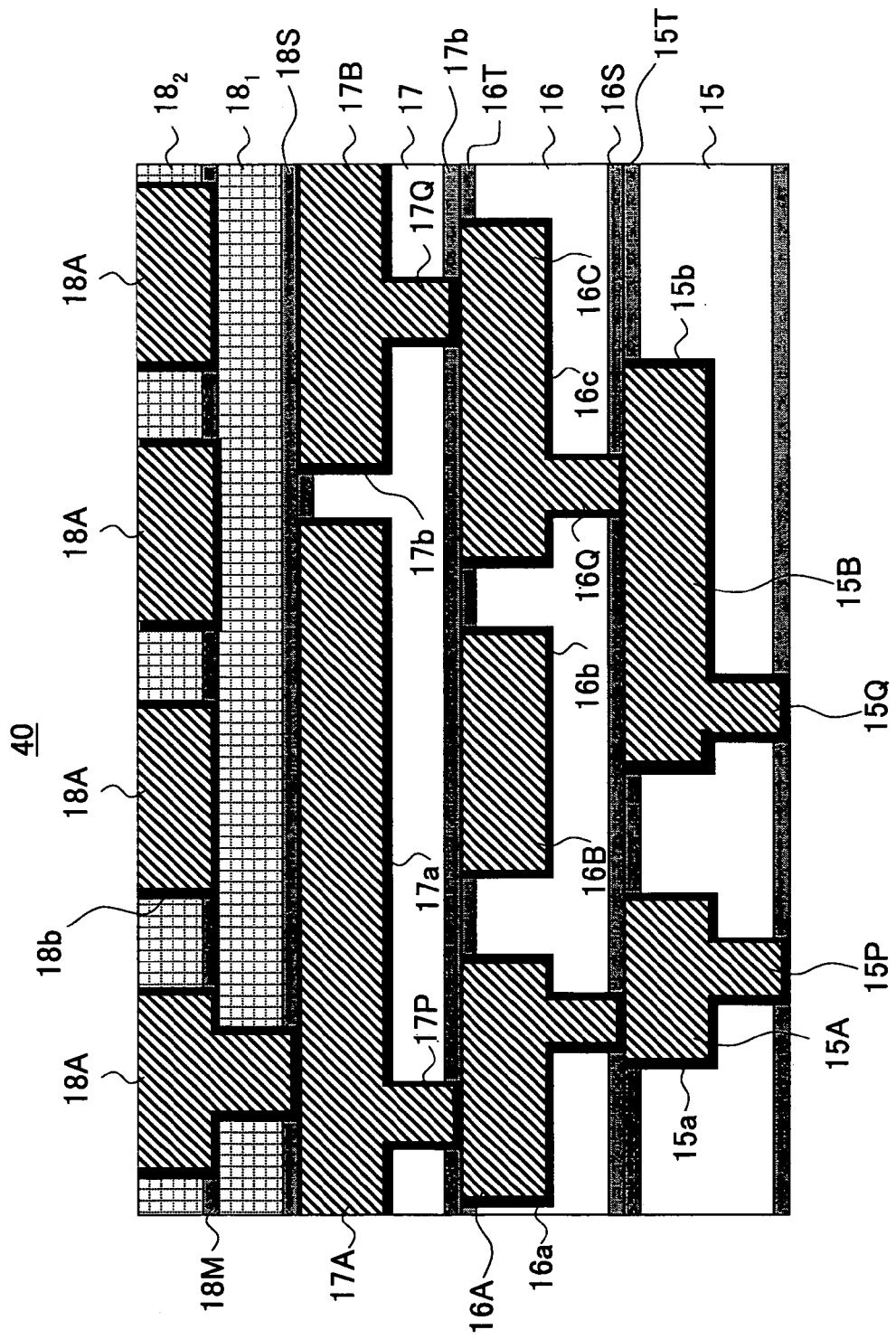

Furthermore, a structure in which the via hole 18V or the interconnection channel 18G is filled with a Cu plug or an interconnection pattern is obtained by filling the via hole 18V or the interconnection channel 18G with a Cu layer after forming a barrier metal layer 18b in the process indicated in FIG. 17 and further eliminating an extra Cu layer by means of a CMP method.

Thus, according to the present embodiment, the generation of a crack caused by stress concentration at the time of patterning can be effectively suppressed in a so-called hybrid-type multi-layer interconnection structure in which an interlayer insulation film with a larger elastic modulus is stacked on a low dielectric constant interlayer insulation film with a small elastic modulus, by making the SiN antireflective film be a no-stress film or a compressive stress film. Herein, a no-stress film includes not only a film in which stress stored in the film is strictly 0 Pa but also a film with the order of ±100 MPa, that is, a film having compressive stress or tensile stress equal to or less than 100 MPa.

Additionally, an antireflective film composed of such a no-stress film or a compressive stress film is not only useful at the time of patterning of the SiOC film 18 but also is useful for suppressing the generation of a crack at the time of patterning of the SiOC film 19 or 20 thereon.

[The Second Embodiment]

In the aforementioned embodiment, a SiN film having compressive stress or no stress as the antireflective film 28R and having a refractive index n and an attenuation constant k being a proper value for an antireflective film is used but the present invention is not limited to a SiN antireflective film and can be applied to, for example, a SiON antireflective film.

Although the SiON film has tensile stress on the order of 200 MPa when formed by means of the normal plasma CVD method, a formed SiON film is made to be a no-stress film or a compressive stress film by using He for a plasma gas in the present embodiment.

The condition of forming such a SiON antireflective film is shown in the following table 3.

TABLE 3

| | |
|---|---|
| $SiH_4$ = | 55 SCCM |
| $N_2O$ = | 105 SCCM |
| He = | 2000 SCCM |
| Gap = | 370 mils |
| RF = | 110 W |
| Process pressure = | 5.5 Torr |
| Temp. = | 350° C. |

Herein, "Gap" in table 3 indicates a distance between the substrate to be processed 52 and the shower head 53 in the plasma CVD apparatus illustrated in FIG. 18. In the present embodiment, no RF bias is applied to the substrate.

Thus obtained SiON antireflective film has compressive stress of 170 MPa and has a refractive index of 2.02 and an attenuation constant k of 0.69, at an exposed-light wavelength of 243 nm, so as to be useful as an antireflective film 28R that causes no crack in the process indicated in FIGS. 14–17.

Additionally, the interlayer insulation films 14–17 as lower layers are made of SiLk in the description of the aforementioned embodiments of the present invention, but the present invention is not limited to this specific material and a film with a relative dielectric constant, typically, equal to or less than 3.0, such as an inorganic siloxane film, an organic siloxane film, and a porous film, as well as aromatic hydrocarbon polymers such as SiLK, and FLARE (a registered trademark for Allied Signal Inc.) can be used as the interlayer insulation films 14–17.

Also, the interlayer insulation films 18–20 as the upper layers are SiOC films in the aforementioned embodiments of the present invention but the present invention is not limited to this specific material and a $SiO_2$ film, F-added $SiO_2$ film, etc. can be used as the interlayer insulation films 18–20.

Furthermore, the present invention is not limited to the embodiments described above and can be subjected to various alterations or modifications within the scope of the claims.

According to the present invention, in a semiconductor device having a multi-layer interconnection structure in which the second interlayer insulation film with a large hardness and a large elastic modulus is stacked on the first interlayer insulation film with a small hardness and a small elastic modulus, the concentration of tensile stress in an antireflective film and, thereby, the problem of the generation of a crack in the multi-layer interconnection structure can be avoided by forming the antireflective film as a film containing tensile stress.

Particularly, the present invention is very useful for suppressing the generation of a crack in a multi-layer interconnection structure in an ultra-fine semiconductor device that contains a fine pattern with a small curvature of radius.

What is claimed is:

1. A method for fabricating a semiconductor device having a multi-layer interconnection structure with a first interlayer insulation film and a second interlayer insulation film that is formed on the first interlayer insulation film and has a hardness and an elastic modulus larger than those of the first interlayer insulation film, comprising the steps of:
    forming a resist film on the second interlayer insulation film via an antireflective film;
    exposing to light and developing the resist film to form a resist pattern; and
    patterning the antireflective film and the multi-layer interconnection structure using the resist pattern as a mask,
    wherein the antireflective film comprises a film with no stress or for storing compressive stress.

2. The method for fabricating a semiconductor device as claimed in claim 1, wherein the value of stress in the antireflective film is not greater than 100 Mpa, where the stress in the film is tensile stress.

3. The method for fabricating a semiconductor device as claimed in claim 1, wherein the antireflective film is a film in which compressive stress is stored.

4. The method for fabricating a semiconductor device as claimed in claim 1, wherein the antireflective film comprises a SiN film.

5. The method for fabricating a semiconductor device as claimed in claim 4, wherein the antireflective film is formed by using a silane gas and an ammonia gas in a nitrogen plasma.

6. The method for fabricating a semiconductor device as claimed in claim 1, wherein the antireflective film is formed while a high-frequency bias is applied to a substrate according to a plasma CVD method and a power of the high-frequency bias is set so that the antireflective film is a no-stress film or a film for storing compressive stress.

7. The method for fabricating a semiconductor device as claimed in claim 1, wherein the antireflective film comprises a SiON film.

8. The method for fabricating a semiconductor device as claimed in claim 7, wherein the antireflective film is formed in a He plasma according to a plasma CVD method.

9. The method for fabricating a semiconductor device as claimed in claim 1, wherein the first interlayer insulation film has a relative dielectric constant equal to or less than 3.0 and the second interlayer insulation film comprises a SiOC film or a $SiO_2$ film.

10. The method for fabricating a semiconductor device as claimed in claim 1, wherein the antireflective film is formed while two high-frequency biases comprising a fist high-frequency bias and a second high-frequency bias are applied to a substrate according to a plasma CVD method and powers of the two high-frequency biases are set so that the antireflective film is a no-stress film or a film for storing compressive stress.

* * * * *